(12) United States Patent
Hsiao

(10) Patent No.: US 6,191,004 B1
(45) Date of Patent: Feb. 20, 2001

(54) METHOD OF FABRICATING SHALLOW TRENCH ISOLATION USING HIGH DENSITY PLASMA CVD

(75) Inventor: Chih-Hsiang Hsiao, Taipei (TW)

(73) Assignee: United Semiconductor Corp., Hsinchu (TW)

( * ) Notice: Under 35 U.S.C. 154(b), the term of this patent shall be extended for 0 days.

(21) Appl. No.: 09/250,749

(22) Filed: Feb. 16, 1999

(30) Foreign Application Priority Data

Dec. 11, 1998 (TW) ................................................ 87120597

(51) Int. Cl.⁷ ...................................................... H01L 21/762
(52) U.S. Cl. ............................................. 438/435; 438/788
(58) Field of Search .................................. 438/692, 787, 438/788, 424, 435, 437

(56) References Cited

U.S. PATENT DOCUMENTS

| | | | |
|---|---|---|---|
| 5,726,090 | * 3/1998 | Jang et al. | 438/437 |
| 5,872,058 | * 2/1999 | Van Cleemput et al. | 438/692 |

* cited by examiner

Primary Examiner—Olik Chaudhuri
Assistant Examiner—Anh Duy Mai
(74) Attorney, Agent, or Firm—Jiawei Huang; J C Patents

(57) ABSTRACT

A method of fabricating a shallow trench isolation includes formation of a trench in a substrate. A high-density plasma chemical vapor deposition is performed with a plasma which does not contain argon gas. A liner oxide layer is formed on the substrate exposed in the trench. Another high-density plasma chemical vapor deposition is performed. A silicon oxide layer is formed. Then, some follow-up steps are performed to complete the shallow trench isolation.

12 Claims, 3 Drawing Sheets

METHOD OF FABRICATING SHALLOW TRENCH ISOLATION USING HIGH DENSITY PLASMA CVD

CROSS-REFERENCE TO RELATED APPLICATION

This application claims the priority benefit of Taiwan application serial no. 8,7120,597, filed Dec. 11, 1998, the full disclosure of which is incorporated herein by reference.

BACKGROUND OF THE INVENTION

1. Field of the Invention

The present invention relates to a semiconductor fabricating method. More particularly, the present invention relates to a method of fabricating an isolation region in a semiconductor substrate.

2. Description of the Related Art

In the semiconductor fabrication process, shallow trench isolations (STI) are frequently used. A shallow trench isolation is formed in an integrated circuit for the purpose of separating neighboring device regions of a semiconductor substrate and preventing the carriers from penetrating through the substrate to neighboring devices. The shallow trench isolation is commonly formed by anisotropically etching to form a trench in the substrate, and depositing an isolation layer in the trench to form an isolation region.

In the above procedure of depositing the isolation layer in the trench, the conventional method uses atmospheric-pressure chemical vapor deposition (APCVD), sub-atmospheric pressure chemical vapor deposition (SACVD), or high-density plasma chemical vapor deposition (HDPCVD) to deposit the isolation layer.

In contrast with the conventional chemical vapor deposition, the HDPCVD step is performed with a lower temperature to form an isolation layer with a high quality. In addition, the isolation layer formed by HDPCVD has a high densification, a high moisture isolation, and a high planarization. Thus, the HDPCVD step of forming the isolation layer into the trench is advantageous to the process for forming a shallow trench isolation.

During the performance of conventional HDPCVD, argon is provided together with oxygen plasma. A deposition step for forming an isolation layer, such as a silicon oxide layer, is performed with a $SiH_4$ source gas. Additionally, bias power is supplied during the deposition step. By supplying bias power, argon plasma is attracted to a chip surface and bombards the chip to form a silicon oxide layer. This process can provide a high-quality silicon oxide layer that has a high step coverage ability.

In FIG. 1. a trench 102 is formed in a substrate 100. A HDPCVD step is performed to form a silicon oxide layer 104 that fills the trench 102. Due to the bias power provided during the entire process of forming the silicon oxide layer 104, the speed of the argon gas is increased to a high level, so that the silicon oxide layer 104 is formed with a good gap-filling ability. However, the argon gas supplied in this conventional method described above has a wide angle. This, in turn, forms clipped 106 on top of the trench 102. Additionally, the high-speed argon gas easily damages the trench 102. which leads to a formation of a damage region 108.

Reference is now made to FIG. 2, which explains another conventional method of forming a shallow trench isolation. A HDPCVD is first performed without providing a bias power. A conformal liner oxide 204, which is made of silicon oxide, is formed on a substrate 200 exposed in a trench 202. A HDPCVD is then performed with bias power. A second silicon oxide layer is formed to fill the trench 202. In the step of forming the liner oxide layer, the HDPCVD is performed without the bias power. In comparison with a process in which a bias power is provided, the speed of argon gas is lowered. In this manner, with a low speed of argon gas, a clipped corner 106 and a damage region 108 (shown in FIG. 1) can be avoided. Unfortunately, in the method described above, the liner oxide layer 204 easily forms overhang top corner 207. Hence, in the step of forming a silicon oxide layer 206, the overhang top corner 207 affects the filling ability of the silicon oxide layer 206, which may further cause a void 208, or voids, to form in the silicon oxide 206.

SUMMARY OF THE INVENTION

The present invention provides a method of fabricating a shallow trench isolation to prevent formations of clipped corners, voids, and damage regions.

To achieve these and other advantages and in accordance with the purpose of the invention, as embodied and broadly described herein, the invention provides a method of fabricating a shallow trench isolation. A pad oxide layer and a mask layer are formed on a substrate. The pad oxide layer, and the mask layer are patterned to form a trench in the substrate. A first high-density plasma chemical vapor deposition is performed without providing argon gas. A conformal liner oxide layer is formed on the trench. A second high-density plasma chemical vapor deposition is performed with argon gas. A silicon oxide layer is formed on the liner oxide layer to fill the trench. A portion of the liner-oxide layer and the silicon oxide layer are removed to form a shallow trench isolation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
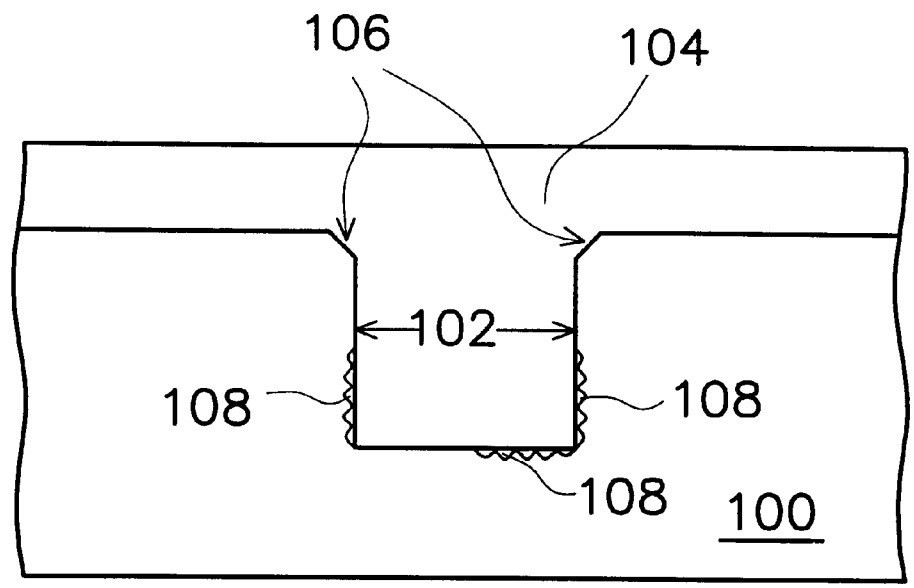
FIG. 1 is schematic, cross-sectional view showing a conventional method of fabricating a shallow trench isolation.
Figure 2:
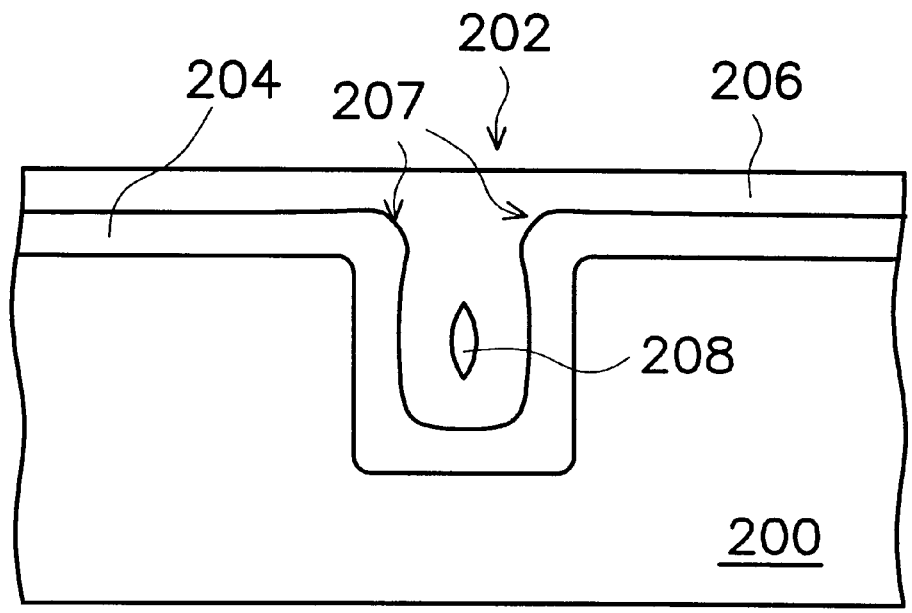
FIG. 2 is schematic, cross-sectional view showing another conventional method of fabricating a shallow trench isolation.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3E are schematic, cross-sectional views showing a method of fabricating a shallow trench isolation according to one preferred embodiment of the invention.

Figure 3A:
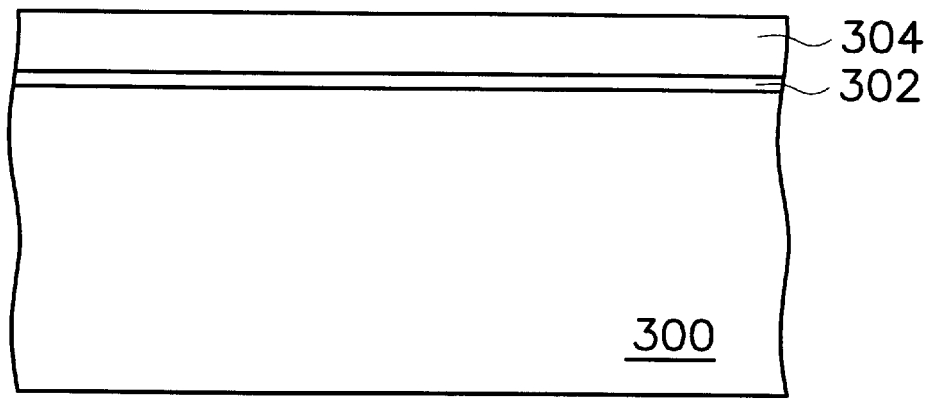
FIGS. 3A through 3E are schematic, cross-sectional views showing a method of fabricating a shallow trench isolation according to one preferred embodiment of the invention.

In FIG. 3A, a pad oxide 302 is formed on a semiconductor substrate 300. A mask layer 304 is formed on the pad oxide layer 302. The mask layer can be, for example, a silicon nitride layer, formed by chemical vapor deposition.

Figure 3B:
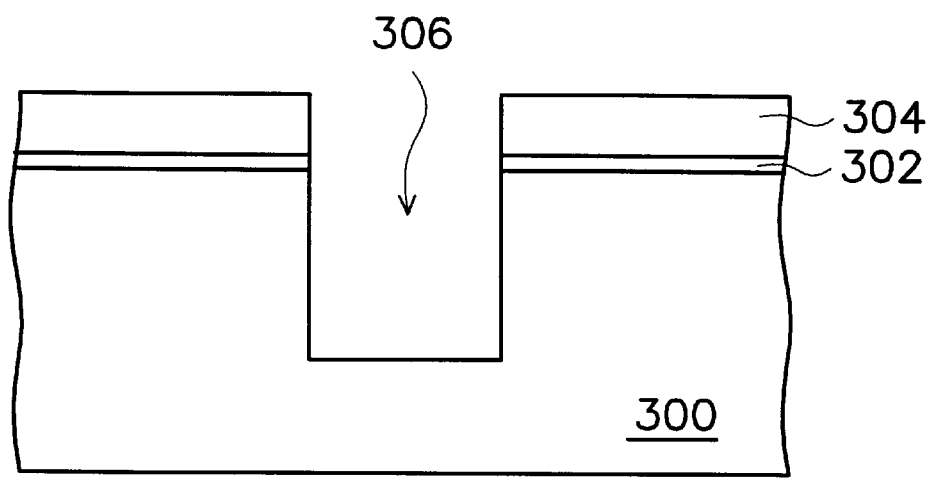

In FIG. 3B, a photolithographic and anisotropic etching process is performed. The mask layer 304 is patterned. An etching step is performed with the mask layer 304 as a mask. The etching step can be, for example, anisotropic dry etching. The pad oxide layer 302 and the substrate 300 are patterned to form a trench 306 in the substrate 300. The depth of the trench 306 preferably is about 4000 Å to 5000 Å.

Figure 3C:
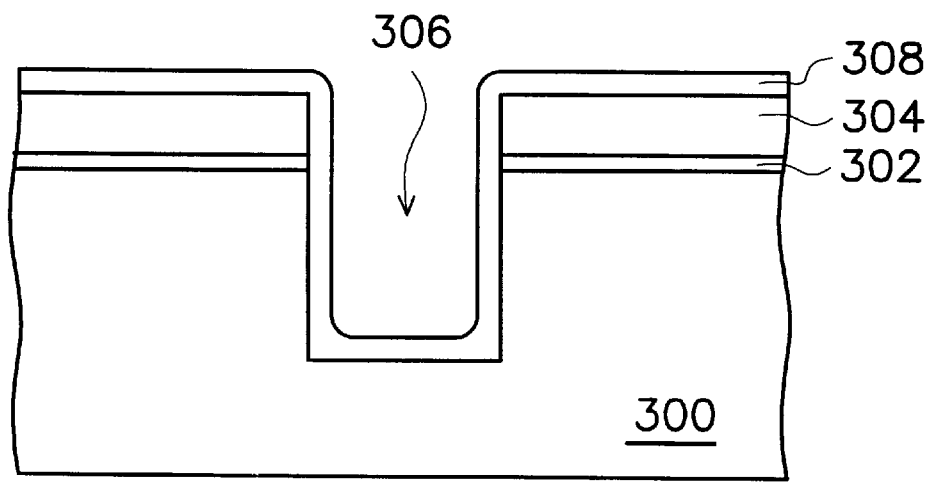

In FIG. 3C. a liner oxide layer 308 is formed over the substrate 300. The liner oxide layer 308 is conformal to the trench 306. The liner oxide layer 308 preferably is formed by the HDPCVD with a preferred bias power of about 3000 W to 4000 W. a preferred $SiH_4$ flow rate of about 20 sccm to 100 sccm, and a preferred oxygen flow rate of about 30 sccm to 200 sccm. Argon gas is not provided in this step. A liner oxide layer 308 is formed with a thickness of about 300 Å to 4000 Å. In this embodiment of the present invention, the argon gas is not provided in HDPCVD. Thus, clipped corners and the damage regions, which arise from the collision by the argon gas, do not form in the trench 306.

Figure 3D:
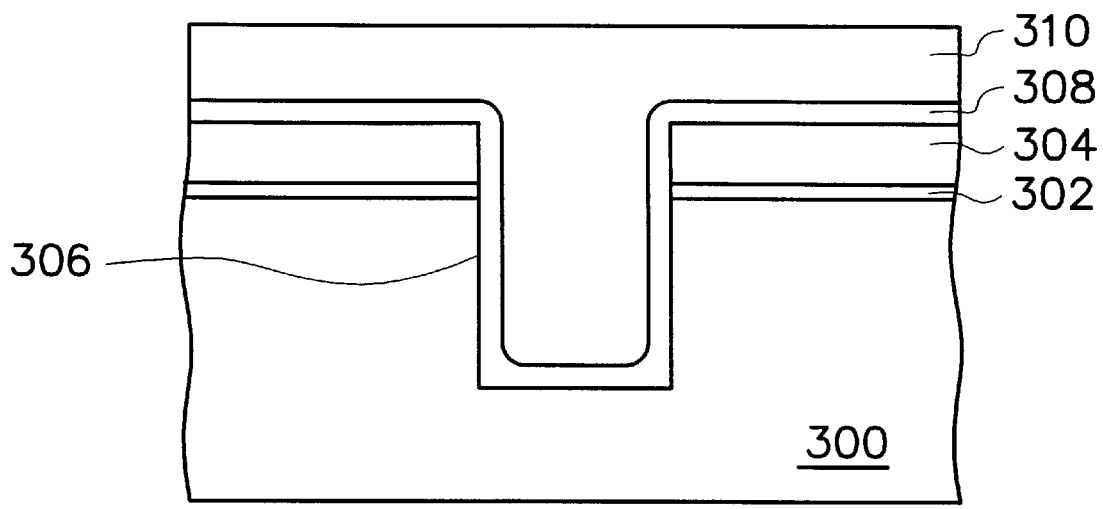

In FIG. 3D, a silicon oxide layer 310 is formed on the liner oxide layer 308 to fill the trench 305. The silicon oxide layer 310 preferably is formed by HDPCVD with a preferred bias power of about 3000 W to 4000 W, a preferred $SiH_4$ flow rate of about 20 sccm to 100 sccm, a preferred oxygen flow rate of about 30 sccm to 200 sccm, and a preferred argon flow rate of about 50 sccm to 400 sccm. The bias power provided in the step of HDPCVD is to enhance the gap-filling ability of the silicon oxide layer 310. With a good gap-filling ability of the silicon oxide layer 310, voids do not form in the trench 306.

Figure 3E:
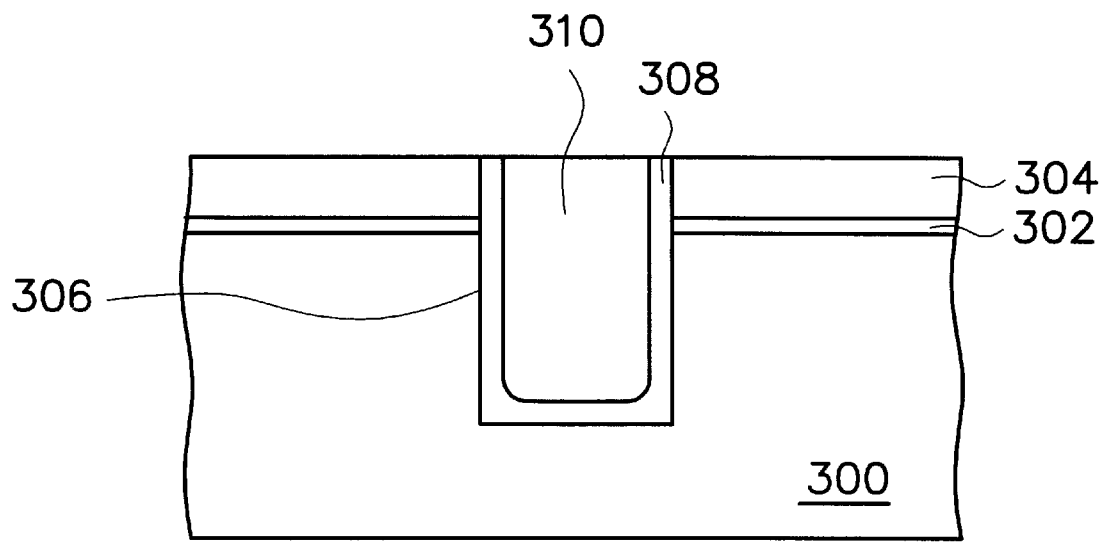

In FIG. 3E, a polishing step is performed with the mask layer 304 as an etching stop. The polishing step can be, for example, chemical mechanical polishing. A portion of the liner oxide layer 308 and a portion of the silicon oxide layer 310 are removed to obtain a smooth surface over the surface. A shallow trench isolation is formed.

In summary, the invention has the following advantages:

1. In the HDPCVD step of forming the liner oxide layer, argon gas is not provided. This prevents clipped corners and damage regions from forming in the trench.

2. In the HDPCVD step of forming a silicon oxide layer, a HDPCVD providing bias power is performed. The gap-filling ability of the silicon oxide thus is increased, which prevents voids from forming in the shallow trench isolation.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation in a substrate, comprising the steps of:
    patterning the substrate to form a trench therein;
    performing a first high-density plasma chemical vapor deposition with a plasma which does not containing argon gas to form a liner oxide layer over the substrate, wherein the liner oxide layer is conformal to a peripheral surface of the trench; and
    forming a silicon oxide layer on the liner oxide layer to fill the trench by performing a second high-density plasma chemical vapor deposition with an argon flow rate of about 50 sccm to about 400 sccm.

2. The method of claim 1, wherein the second high-density plasma chemical vapor deposition is performed with a bias power of about 3000 W to 4000 W.

3. The method of claim 1, wherein the second high-density plasma chemical vapor deposition is performed with a $SiH_4$ flow rate of about 20 sccm to 100 sccm.

4. The method of claim 1, wherein the second high-density plasma chemical vapor. deposition is performed with an oxygen flow rate of about 30 sccm to 200 sccm.

5. A method of fabricating a shallow trench isolation, comprising the steps of:
    forming a pad oxide layer and a mask layer on a substrate;
    patterning the pad oxide layer, the mask layer, and the substrate to form a trench in the substrate;
    performing a first high-density plasma chemical vapor deposition with a plasma which does not containing argon gas to form a liner oxide layer over the substrate, wherein the liner oxide layer is conformal to a peripheral surface of the trench; and
    forming a silicon oxide layer on the liner oxide layer to fill the trench by performing a second high-density plasma chemical vapor deposition with an argon flow rate of about 50 sccm to about 400 sccm.

6. The method of claim 5, wherein the first high-density plasma chemical vapor deposition is performed with a bias power of about 3000 W to 4000 W.

7. The method of claim 5, wherein the first high-density plasma chemical vapor deposition is performed with a $SiH_4$, flow rate of about 20 sccm to 100 sccm.

8. The method of claim 5, wherein the first high-density plasma chemical vapor deposition is performed with an oxygen flow rate of about 30 sccm to 200 sccm.

9. The medthod of claim 1, wherein the second high-density plasma chemical vapor desposition is performed with a bias power of about 3000 W to 4000 W.

10. The method of claim 1, wherein the second high-density plasma chemical vapor deposition is performed with a $Si_4$ flow rate of about 20 sccm to 100 sccm.

11. The method of claim 1, wherein the second high-density plasma chemical vapor deposition is performed with an oxygen flow rate of about 30 sccm to 200 sccm.

12. The method of claim 1, further comprising removing the mask layer and the silicon oxide layer to form a shallow trench isolation.

* * * * *